US006665217B2

United States Patent
Morishita et al.

(10) Patent No.: US 6,665,217 B2
(45) Date of Patent: Dec. 16, 2003

(54) SEMICONDUCTOR MEMORY DEVICE INCLUDING INTERNAL POWER CIRCUIT HAVING TUNING FUNCTION

(75) Inventors: Fukashi Morishita, Hyogo (JP); Yasuhiko Taito, Hyogo (JP); Akira Yamazaki, Hyogo (JP); Mako Okamoto, Hyogo (JP); Nobuyuki Fujii, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 71 days.

(21) Appl. No.: 10/120,575

(22) Filed: Apr. 12, 2002

(65) Prior Publication Data

US 2003/0021162 A1 Jan. 30, 2003

(30) Foreign Application Priority Data

Jul. 24, 2001 (JP) .......................... 2001-223211

(51) Int. Cl.$^7$ ................................ G11C 7/00
(52) U.S. Cl. .................. 365/189.11; 365/226
(58) Field of Search ............ 365/189.11, 226, 365/227, 189.09; 327/530, 540, 541

(56) References Cited

U.S. PATENT DOCUMENTS 6,052,313 A * 4/2000 Atsumi et al. ......... 365/189.05
6,333,864 B1 * 12/2001 Nishimura et al. ......... 363/78

FOREIGN PATENT DOCUMENTS

JP     4-218935     8/1992
JP     11-233634     8/1999

* cited by examiner

*Primary Examiner*—Anh Phung
(74) *Attorney, Agent, or Firm*—McDermott, Will & Emery

(57) ABSTRACT

A tuning control circuit includes fuse devices each shifting from a conductive state to an interrupted state in response to a program input from the outside, and signal driving circuits for driving the signal levels of tuning control signals in accordance with the states of the fuse devices. A reference voltage generating circuit generates a reference voltage corresponding to a reference value of a memory array voltage of a semiconductor memory device according to the invention in accordance with an electrical resistance value which is finely adjusted in response to the tuning control signals.

17 Claims, 10 Drawing Sheets

SEMICONDUCTOR MEMORY DEVICE INCLUDING INTERNAL POWER CIRCUIT HAVING TUNING FUNCTION

BACKGROUND OF THE INVENTION

1. Field of the Invention

The present invention relates to a semiconductor memory device and, more particularly, to a semiconductor memory device including an internal power circuit having a tuning function by using a fuse device or the like.

2. Description of the Background Art

In the field of data process and the like, to process data at high speed with lower power consumption, a circuit device called a system LSI (Large Scale Integrated circuit) in which a logic such as a processor and a memory device are integrated on the same semiconductor chip is widely used. In the system LSI, the logic and the memory device are connected to each other by wiring on the chip, so that multi-bit data can be transferred between the logic and the memory device at high speed.

FIGS. 7A and 7B are diagrams for explaining a conventional layout of an internal power circuit in a semiconductor memory device.

Referring to FIG. 7A, a semiconductor memory device 1 has memory arrays 2a and 2b, a decoder band 3, and an internal power circuit 4. Via external pads 5, external signals are transmitted/received to/from semiconductor memory device 1 mounted on a system LSI, and an external source voltage is supplied to semiconductor memory device 1. External pads 5 includes a power source pad 5a for receiving the supply of an external source voltage Ext.VDD and a signal pad 5b via which signals are transmitted/received to/from the outside.

FIG. 7B is an enlarged view of an area 50 shown in FIG. 7A, in which fuse devices FS and internal wiring are disposed.

A plurality of memory cells arranged in a matrix for storing data and peripheral circuits for reading/writing data from/to the memory cells are generically called as memory arrays 2a and 2b.

Decoder band 3 decodes a command control signal and an address signal supplied via signal pad 5b. Internal power circuit 4 receives external source voltage Ext.VDD supplied from the outside via power source pad 5a and generates internal source voltages for operating memory arrays 2a and 2b.

FIG. 8 is a schematic block diagram showing the configuration of internal power circuit 4.

Referring to FIG. 8, internal power circuit 4 includes a reference voltage generating unit 10, a memory array voltage (VDDS) generating circuit 20, a boosted voltage (VPP) generating circuit 30, and a negative voltage (VBB) generating circuit 40. Memory array voltage (VDDS), boosted voltage (VPP), and negative voltage (VBB) are collectively called the internal source voltages.

Reference voltage generating unit 10 includes reference voltage generating circuits 12 and 14. Reference voltage generating circuit 12 receives external source voltage Ext.VDD and generates a reference voltage VREFS as a reference value of memory array voltage VDDS. Reference voltage generating circuit 14 receives external source voltage Ext.VDD and generates a reference voltage VREFP as a reference value of boosted voltage VPP. For example, 3.3V is applied as external source voltage Ext.VDD.

Memory array voltage generating circuit 20 includes a voltage comparator 22 and a driver transistor 25, and controls the voltage level of an internal power line 27 for supplying memory array voltage VDDS in accordance with reference voltage VREFS. For example, memory array voltage VDDS is set to 2.0 V.

Voltage comparator 22 compares memory array voltage VDDS with reference voltage VREFS. Driver transistor 25 is electrically connected between external source voltage Ext.VDD and internal power line 27 and receives an output of voltage comparator 22 by its gate.

Concretely, when memory array voltage VDDS drops below reference voltage VREFS (2.0 V), an output of voltage comparator 22 is activated to the "L level (logic low)" and driver transistor 25 is turned on. Consequently, an operation current is supplied from external source voltage Ext.VDD to internal power line 27. On the other hand, when memory array voltage VDDS is higher than reference voltage VREFS, an output of voltage comparator 22 is made inactive to the "H level (logic high)". In response to this, driver transistor 25 is turned off. As a result, the supply of the operation current to internal power line 27 is stopped.

Boosted voltage generating circuit 30 receives external source voltage Ext.VDD and generates boosted voltage VPP based on reference voltage VREFP. Boosted voltage VPP is used as a gate voltage for turning on a transistor provided to transmit H-level data (memory array voltage VDDS) to a memory cell. It is therefore necessary to set boosted voltage VPP to a voltage higher than a sum of memory array voltage VDDS and a threshold voltage Vth of the transistor. For example, boosted voltage VPP is set to 3.6V.

Boosted voltage generating circuit 30 includes: a voltage divider 32 for dividing a voltage of an internal power line 31 for transmitting boosted voltage VPP; a detecting circuit 34 for comparing voltage VDPP obtained by the dividing operation of voltage divider 32 with reference voltage VREFP; an oscillator 35 which is set in an operative state in accordance with a result of detection of detecting circuit 34 to generate a pump clock; and a charge pump circuit 36 for executing boosting operation in response to the pump clock generated by oscillator 35.

Voltage divider 32 divides the voltage of internal power line 31 to, for example, ½ and outputs divided voltage VDPP. Detecting circuit 34 receives reference voltage VREFP (1.8 V) determined in consideration of the reference value of boosted voltage VPP and the voltage dividing ratio in voltage divider 32. When the divided voltage VDPP drops below reference voltage VREFP, oscillator 35 is set in the operative state.

In the operative state, oscillator 35 generates a pump clock and supplies it to charge pump circuit 36. Charge pump circuit 36 performs charge pumping operation on the basis of the pump clock from oscillator 35 to boost external source voltage Ext.VDD, thereby generating boosted voltage VPP. On the other hand, when boosted voltage VPP is higher than the reference value, oscillator 35 is set in an inoperative state to stop the generation of the pump clock. The voltage boosting operation by charge pump circuit 36 is not therefore executed.

Negative voltage generating circuit 40 receives external source voltage Ext.VDD and generates negative voltage VBB. Negative voltage VBB is used to suppress a leak current in an access transistor of a memory cell. For example, negative voltage VBB is set to −1.0 V.

Negative voltage generating circuit 40 includes a detecting circuit 44, an oscillator 45, and a charge pump circuit 46.

When the voltage level of an internal power line 41 for supplying negative voltage VBB exceeds −1.0 V as a reference value, detecting circuit 44 sets oscillator 45 to an operative state.

In an operative state, oscillator 45 supplies the pump clock to charge pump circuit 46. Charge pump circuit 46 executes a negative charge pump operation on the basis of the pump clock from oscillator 45 to supply negative charges to internal power line 41. On the other hand, when negative voltage VBB is lower than a reference voltage −1.0 V, oscillator 45 is set in an inoperative state to stop generation of the pump clock. As a result, the supply of negative charges by charge pump circuit 46 is stopped.

With such a configuration, the internal source voltages of memory array voltage VDDS, boosted voltage VPP, and negative voltage VBB can be controlled so as to coincide with reference values.

Since the internal source voltages exert a great influence on the data retaining characteristic of a memory cell and access characteristic, high control accuracy is required. Before the manufacturing stage, an internal power circuit is designed so that the internal source voltages become at desired levels. However, an actually fabricated chip is influenced by manufacture process variations, so that a desired internal source voltage level cannot be always output by the internal power circuit. There is also a case that the internal source voltage level has to be changed due to an influence of manufacture variations in a memory array.

Consequently, a configuration of providing the internal power circuit with a tuning function by using a program device such as a fuse is generally employed. For example, in the configuration of FIG. 8, to accurately set or finely adjust the levels of reference voltages VREFS and VREFP in reference voltage generating circuits 12 and 14, or to accurately set or finely adjust −1.0 V corresponding to the reference value of negative voltage VBB in the detecting circuit 44, the tuning function is used.

A concrete configuration of a circuit group having the tuning function will now be described.

FIG. 9 is a circuit diagram showing the configuration of reference voltage generating circuit 12 for memory array voltage VDD.

Referring to FIG. 9, reference voltage generating circuit 12 includes current source 50 disposed between a node Ns for generating reference voltage VREFS and external source voltage Ext.VDD, for supplying a constant current Is, P-channel MOS transistors 51 to 55, 57, and 58 connected in series between node Ns and a ground voltage VSS, and fuse devices FS1s to FS4s.

The gates of transistors 51 to 55 and 58 are connected to ground voltage VSS. Transistor 57 is connected so as to form a diode. A voltage drop caused by transistors 57 and 58 therefore becomes 2Vth corresponding to twice as high as threshold voltage Vth of the transistor.

Fuse devices FS1s to FS4s are connected in parallel with transistors 51 to 54, respectively. Since transistors 51 to 55 and 57 whose gates are connected to ground voltage VSS act as resistive elements, in a conductive state before each of fuse devices FS1s to FS4s is blown, each of fuse devices FS1s to FS4s forms a bypass of a corresponding transistor acting as a resistive element.

On the other hand, the fuse device shifted to a nonconductive state by being blown closes the bypass, so that constant current Is is passed to the corresponding transistor (resistive element).

As described above, an electrical resistance value RS to be added to the current path of constant current Is is finely adjusted according to the states of fuse devices FS1s to FS4s. The voltage level of reference voltage VREFS generated at node Ns changes depending on electrical resistance value RS between nodes Ns and N0. Consequently, by selectively blowing (disconnecting) fuse devices FS1s to FS4s, reference voltage VREFS can be finely adjusted.

FIG. 10 is a circuit diagram showing the configuration of reference voltage generating circuit 14 for boosted voltage VPP.

Referring to FIG. 10, reference voltage generating circuit 14 includes a current source 60 disposed between a node Np for generating reference voltage VREFP and external source voltage Ext.VDD, for supplying a constant current Is, P-channel MOS transistors 61 to 65, 67, and 68 connected in series between node Np and ground voltage VSS, and fuse devices FS1p to FS4p.

Reference voltage generating circuit 14 has a configuration similar to that of reference voltage generating circuit 12 shown in FIG. 9 but an electrical resistance value RP between nodes Np and N1 is set independently of electrical resistance value RS in FIG. 8. In a manner similar to reference voltage generating circuit 12, by selectively blowing fuse devices FS1p to FS4p, reference voltage VREFP corresponding to the reference value of boosted voltage VPP can be finely adjusted.

FIG. 11 is a circuit diagram showing the configuration of detecting circuit 44.

Referring to FIG. 11, detecting circuit 44 includes: a current source 70 connected between external source voltage Ext.VDD and a node Na; an N-channel MOS transistor 71 connected between node Na and ground voltage VSS; a P-channel MOS transistor 72 electrically connected between external source voltage Ext.VDD and a node Nb; a P-channel MOS transistor 73 electrically connected between external source voltage Ext.VDD and a node Nc; an N-channel MOS transistor 74 electrically connected between nodes Nb and Nv; an N-channel MOS transistor 75 electrically connected between node Nc and ground voltage VSS; and a buffer 76 for outputting a detection signal on the basis of a voltage of node Nc.

A detection signal output from buffer 76 is transmitted to oscillator 45 shown in FIG. 7. The gates of transistors 71, 74, and 75 are connected to node Na. The level of the voltage of node Nc, that is, a detection signal is determined according to a voltage difference between ground voltage VSS and a node Nv corresponding to a virtual ground node.

Detecting circuit 44 further includes N-channel MOS transistors 80 to 84 connected in series between a node Ni to which negative voltage VBB is supplied and node Nv and fuse devices FS1b to FS4b connected in parallel with transistors 81 to 84, respectively.

Each of the gates of transistors 80 to 84 is connected to ground voltage VSS. Each of transistors 80 to 84 acts as a resistive element. An electrical resistance value RB between nodes Nv and Ni can be finely adjusted by selectively blowing fuse devices FS1b to FS4b.

When negative voltage VBB (for example, −1.0 V) of the reference value is applied to node Ni, the voltage at node Nv has to be set to ground voltage VSS. Specifically, electrical resistance value RB is finely adjusted so that a voltage drop between nodes Nv to Ni is equal to the difference (for example, 1.0 V) between ground voltage VSS and the reference value of negative voltage VBB.

With such a configuration, when negative voltage VBB exceeds the reference value, the voltage at node Nv becomes higher than ground voltage VSS. The voltage at node Nc is accordingly changed to the ground voltage VSS side, and a detection signal is activated to the L level. In response to this, oscillator 45 generates a pump clock.

On the contrary, when negative voltage VBB does not exceed the reference value, node Nc changes to the Ext.VDD side and a detection signal is made inactive to the H level. In this case, oscillator 45 stops the supply of the pump clock.

By using the tuning function as described above, a desired internal source voltage can be generated in consideration of manufacture process variations.

Referring again to FIG. 7A, to minimize the voltage drop from power source pad 5a to internal power circuit 4 and supply the internal source voltage generated by internal power circuit 4 to memory arrays 2a and 2b with the minimum voltage drop, it is desirable to shorten the distance between the external pad and the memory array as much as possible. It is desirable to assure a sufficient line width for an internal line such as a power source line disposed in internal power circuit 4. From such a viewpoint, internal power circuit 4 is disposed so as to be elongated in the chip peripheral portion along memory arrays 2a and 2b as internal circuits.

The layout of reference voltage generating unit 10, memory array source generating circuit 20, boosted voltage (VPP) generating circuit 30, and negative voltage (VBB) generating circuit 40 shown in FIG. 8 is determined so as to be adjusted to the shape of internal source circuit 4.

As described with reference to FIGS. 8 to 11, in reference voltage generating unit 10 and VBB generating circuit 40, fuse devices for the tuning function are disposed. In FIG. 7A, fuse devices FS1s to FS4s, FS1p to FS4p, and FS1b to FS4b shown in FIGS. 9 to 11 are collectively referred to as fuse devices FS.

As the material of the fuse device, aluminum is typically used. An aluminum fuse is generally blown with a laser beam after a chip is fabricated.

However, since a laser blowing input (laser beam) is passed, another aluminum wiring layer cannot be disposed as an upper or lower layer of the fuse device. It is difficult to dispose an aluminum wiring layer used for a purpose other than a fuse also around the aluminum fuse so as not to be to damaged by the blowing with the laser beam.

By providing the fuse device in the internal power circuit desirably to have an elongated shape, the designing becomes difficult.

Referring again to FIG. 7B, in an area 50 in internal power circuit 4, power lines L1 and L2 have to be designed so as to bypass fuses FS and so that the line width is narrowed around fuse FS. In order to reduce wiring bypassing the fuse as much as possible, the layout of the function blocks has to be also regulated. Consequently, it becomes difficult to make a floor plan of the internal power circuit.

In the internal power circuit, a high-impedance signal line which has to be shielded like a signal line L3 exists. High-impedance signal line L3 is a line for transmitting reference voltage VREFP or VREFS shown in FIG. 8 to a VDDS generating circuit or the like. For such a high-impedance signal line, shielding wires LS1 and LS2 have to be disposed in an adjacent area. When the number of such layout restrictions increases, it is feared that electric characteristics deteriorate such that the shielding wires cannot be sufficiently disposed.

To solve such problems, it is sufficient to dispose the fuse devices independent of the power circuit layout or at an end of the power circuit layout. However, when the length of the line between the fuse and the internal power circuit is simply increased, the voltage level of the high-impedance signal line becomes unstable due to noises occurring on the line, so that it is feared that the control characteristics of the internal power circuit deteriorate.

As a method of disposing the fuse device in a position away from the power circuit, for example, the technique of Japanese Patent Laying-Open No. 11-233634(1999) has been disclosed. In the configuration disclosed in the publication, however, a fuse disposed in a position apart from the power circuit is provided for a test but not for realizing the tuning function in the internal power circuit. Therefore, by the technique disclosed in the publication, the problems as described above cannot be solved.

SUMMARY OF THE INVENTION

An object of the invention is to provide a semiconductor memory device including an internal power circuit having a tuning function, of which layout such as a floor plan and a wiring plan can be easily designed and of which circuit operation is stabilized.

A semiconductor memory device according to the invention includes an internal circuit operating on supply of an internal source voltage; and an internal power circuit for receiving an external source voltage and generating the internal source voltage. The internal power circuit includes: a plurality of internal lines; a plurality of program devices disposed in an area different from an area in which the plurality of internal lines are disposed and each shifting from a first state to a second state in response to a program input from the outside (external to said internal power circuit); a plurality of signal driving circuits provided in correspondence with the plurality of program devices and each for driving a control signal having a level according to the state of a corresponding one of the program devices; and an internal voltage generating circuit for adjusting the level of the internal source voltage on the basis of the control signal driven by each of the plurality of signal driving circuits.

In such a semiconductor memory device, a plurality of internal lines can be disposed flexibly without bypassing program devices disposed for realizing the tuning function while sufficiently assuring the line width. Thus, the designing of the internal power circuit is facilitated and the stabilized circuit operation can be realized.

Preferably, the internal voltage generating circuit has: a reference voltage generating unit for generating a reference voltage corresponding to a reference value of the internal source voltage; and an internal voltage driving unit for controlling the internal source voltage on the basis of comparison between the internal source voltage and the reference voltage, and the reference voltage generating unit adjusts the reference voltage on the basis of the control signal.

Preferably, the internal voltage generating circuit includes: a detecting unit for detecting that the internal source voltage exceeds a reference value; and an internal voltage driving portion for controlling the internal source voltage on the basis of a detection result of the detecting portion, and the detecting unit adjusts the reference value on the basis of the control signal.

Preferably, the semiconductor memory device further includes a power source pad for receiving supply of the external source voltage. The internal power circuit is disposed in an elongated shape between the internal circuit and the power source pad along an peripheral portion of the internal circuit.

With such a configuration, a voltage drop in an external source voltage and an internal source voltage can be suppressed.

Particularly, in the configuration, the program devices are disposed in a chip peripheral portion.

Alternately, in the configuration, the program devices are disposed in an end portion of the internal power circuit.

Preferably, a circuit device group constructed by the internal voltage generating circuit and the plurality of signal driving circuits is disposed on the inner side of the plurality of program devices in the chip along a longitudinal direction of the internal power circuit.

With the configuration, the lines and circuit devices disposed on the upper and lower areas of the fuse devices can be further reduced, and improved flexibility in designing can be achieved.

Preferably, the plurality of internal lines include a program device control line for transmitting signals for controlling current passage to the plurality of program devices, and a line group other than the program device control line in the plurality of internal lines is disposed on the inner side of the plurality of program devices of the chip along a longitudinal direction of the internal power circuit.

Preferably, the internal power circuit further includes a program device energization control circuit for controlling current passage to the plurality of program devices. Circuit elements as a components of the internal power circuit is disposed on the inner side of the plurality of program devices of the chip along a longitudinal direction of the internal power circuit except for a circuit device group constructing the program device energization control circuit.

Preferably, the internal power circuit further includes a program device energization control circuit for controlling current passage to the plurality of program devices, and circuit elements as components of the plurality of signal driving circuits and the program device energization control circuit are disposed in an area different from an area in which other circuit devices in the internal power circuit are disposed.

Preferably, the semiconductor memory device further includes: a signal pad for inputting/outputting signals from/to the internal circuit; and a signal line provided between the signal pad and the internal circuit, for transmitting the signal. The plurality of internal lines are disposed without crossing the signal line.

With such a configuration, the tuning function in the internal power circuit can be displayed while further increasing noise resistance.

More preferably, the program devices are disposed at both ends in the longitudinal direction of the internal power circuit.

More preferably, alternately, the program devices are disposed only at one end in the longitudinal direction of the internal power circuit.

Preferably, the internal circuit includes a memory array portion including a plurality of memory cells for storing data and peripheral circuits for reading/writing data from/to the plurality of memory cells.

Consequently, by using the internal power circuit which can be easily designed, a voltage used in the memory array portion can be finely adjusted.

Preferably, the program device is a fuse device which can be blown by a laser beam applied from the outside.

Alternately, it is preferable that the program device is a fuse device which can be blown by a high voltage applied from the outside.

With such a configuration, even after package molding, a program can be entered from the outside.

Preferably, the plurality of internal lines include a first line in a high impedance state and a second line for shielding the first line.

With the configuration, the layout having increased noise resistance can be designed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
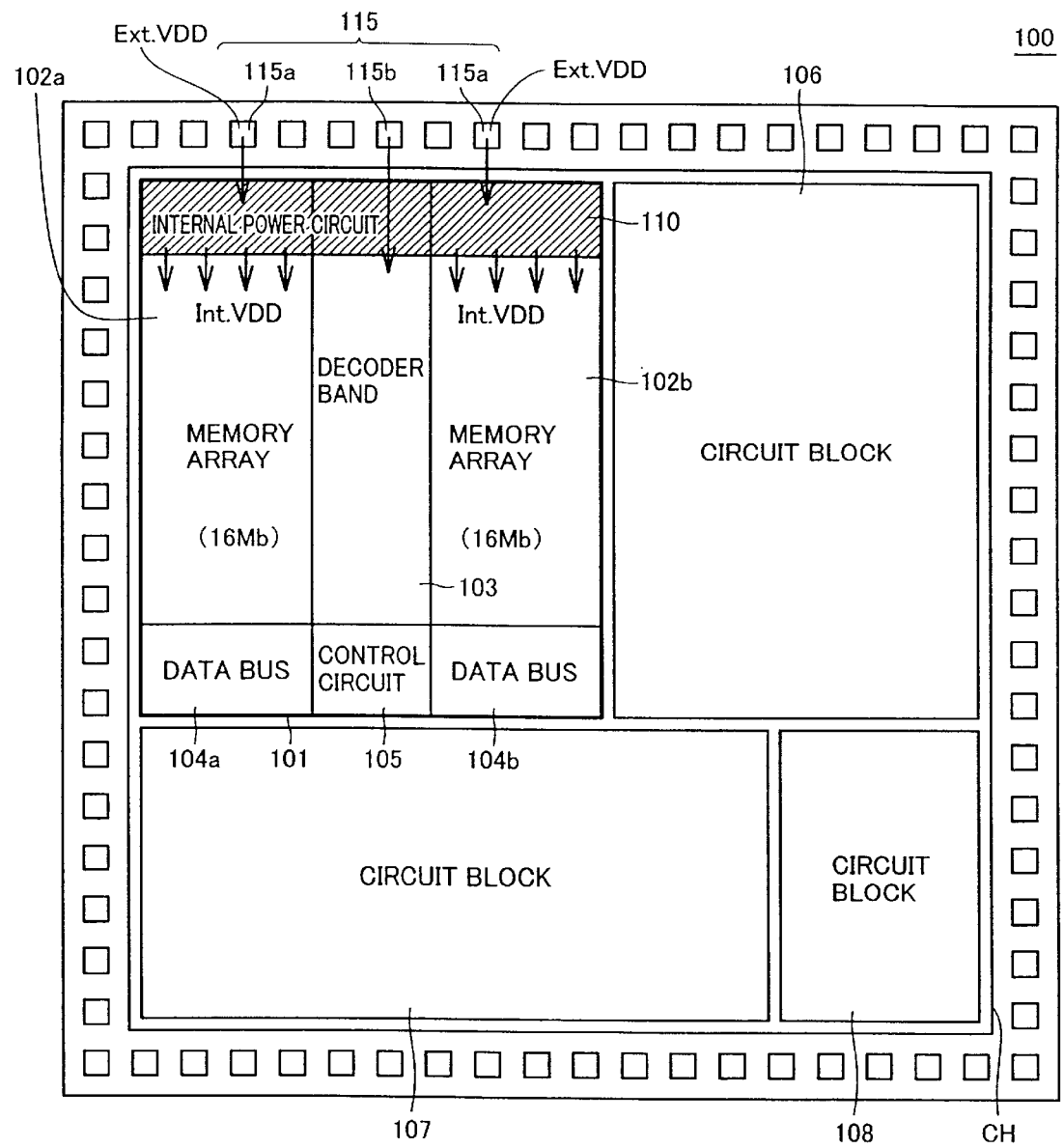
FIG. 1 is a schematic block diagram for explaining the configuration of a system LSI on which a semiconductor memory device according to an embodiment of the invention is mounted.

Embodiments of the invention will be described in detail hereinbelow by referring to the drawings. The same reference numeral in the drawings denotes the same or corresponding component.

First Embodiment

FIG. 1 shows the configuration of a system LSI on which a semiconductor memory device according to an embodiment of the invention is mounted.

Referring to FIG. 1, a system LSI 100 formed on a semiconductor chip CH has a semiconductor memory device 101 according to the invention, and circuit blocks 106, 107, and 108. Each of circuit blocks 106, 107, and 108 is constructed by a logic circuit, a static random access memory (SRAM), a dynamic random access memory (DRAM), or the like.

Semiconductor memory device 101 includes memory arrays 102a and 102b, a decoder band 103, data buses 104a and 104b, and a control circuit 105. Signals are input/output to/from system LSI 100 and a power is supplied to system LSI 100 via external pads 115. External pads 115 include a power source pad 115a for receiving the supply of external source voltage Ext.VDD and a signal pad 115b via which signals are transmitted/received to/from the outside.

Each of memory arrays 102a and 102b has a plurality of memory cells (not shown) arranged in a matrix for storing data and peripheral circuits for inputting/outputting data to/from the memory cells. For example, as memory arrays 102a and 102b, DRAM arrays of the same capacity (16 MB) are arranged symmetrical with respect to decoder band 103 as a center.

Decoder band 103 decodes control signals and address signals from the outside, which are input via signal pads 115b. Control circuit 105 controls the whole operations of semiconductor memory device 101 to execute operations according to a decoding result of decoder band 103. Data buses 104a and 104b are disposed in correspondence with memory arrays 102a and 102b, respectively, for transmitting data input/output from/to memory arrays 102a and 102b.

Semiconductor memory device 101 further includes an internal power circuit 110 for receiving the supply of external source voltage Ext.VDD from power source pad 115a and generating internal source voltage Int.VDD used in semiconductor memory device 101.

As described in the conventional technique, internal power circuit 110 is disposed in an elongated shape in a chip peripheral portion along a side of memory arrays 102a and 102b as internal circuits to minimize the voltage drop which occurs between power source pads 115b and memory arrays 102a and 102b.

Figure 2:
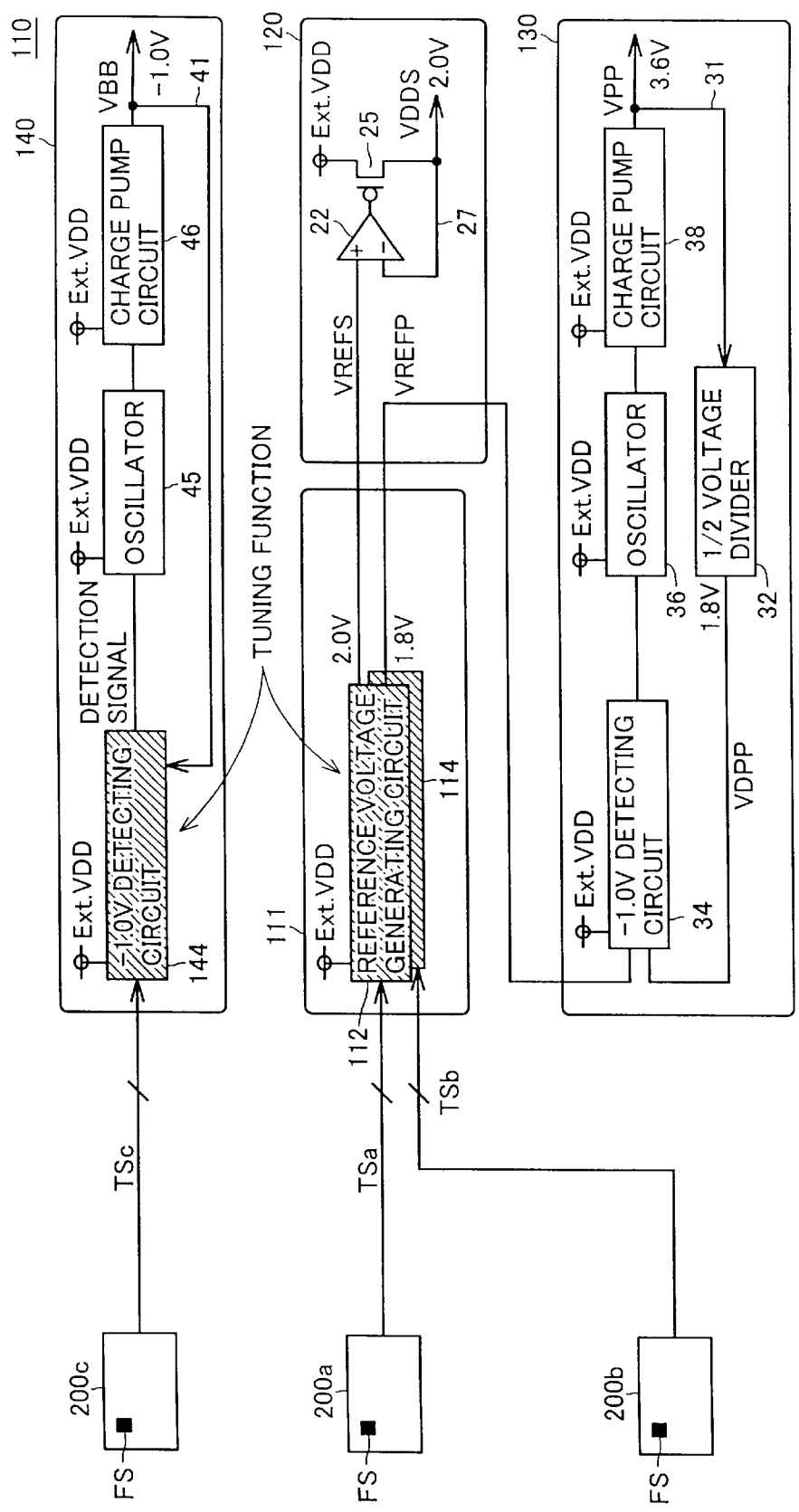
FIG. 2 is a schematic block diagram showing the configuration of an internal power circuit illustrated in FIG. 1.

Referring to FIG. 2, internal power circuit 110 includes a reference voltage generating unit 111, a memory array voltage (VDDS) generating circuit 120, a boosted voltage (VPP) generating circuit 130, and a negative voltage (VBB) generating circuit 140.

Memory array voltage (VDDS), boosted voltage (VPP), and negative voltage (VBB) are generically called internal source voltages Int.VDD. Since the applications and the voltage levels of memory array voltage (VDDS), boosted voltage (VPP), and negative voltage (VBB) are similar to those described in the conventional technique, the detailed description will not be repeated.

Reference voltage generating portion 111 includes reference voltage generating circuits 112 and 114. Reference voltage generating circuit 112 receives external source voltage Ext.VDD and generates reference voltage VREFS as a reference value of memory array voltage VDDS. Reference voltage generating circuit 114 receives external source voltage Ext.VDD and generates reference voltage VREFP as a reference value of boosted voltage VPP.

Memory array voltage generating circuit 120 includes voltage comparator 22 and driver transistor 25. The configuration and operation of memory array voltage generating circuit 120 are similar to those of memory array voltage generating circuit 20 shown in FIG. 8, so that the detailed description will not be repeated.

Boosted voltage generating circuit 130 includes voltage divider 32, detecting circuit 34, oscillator 35, and charge pump circuit 36. Since the configuration and operation of boosted voltage generating circuit 130 are similar to those of boosted voltage generating circuit 30 shown in FIG. 8, the detailed description will not be repeated.

Negative voltage generating circuit 140 includes a detecting circuit 144, oscillator 45, and charge pump circuit 46. Negative voltage generating circuit 140 is different from negative voltage generating circuit 40 shown in FIG. 8 with respect to a point that detecting circuit 144 is included in place of detecting circuit 44. The functions of oscillator 45 and charge pump circuit 46 which operate in response to a detection signal from detecting circuit 144 are similar to those described by referring to FIG. 8, so that the detailed description will not be repeated.

In the first embodiment of the invention, the configurations of reference voltage generating circuits 112 and 114 and detecting circuit 144 having the tuning function and, particularly, the layout of the fuse devices used as program devices are different from those of the prior art.

Internal power circuit 110 further includes tuning control circuits 200a, 200b, and 200c. Tuning control circuits 200a and 200b are provided in correspondence with reference voltage generating circuits 112 and 114, respectively. Tuning control circuit 200c is provided in correspondence with detecting circuit 144.

Each of tuning control circuits 200a, 200b, and 200c includes a program device FS. Each program device shifts from a conductive state to a nonconductive state or from a noncouductive state to a conductive state in response to a program input from the outside.

As a program device, an aluminum fuse which can be blown with a laser beam, an electrical fuse which can be blown by applying a high voltage from the outside, and the like can be used. Particularly, in the case of using the electrical fuse, a program can be entered from an external terminal even after package molding.

In the following, the program device will be also simply called fuse device FS. In FIG. 2, each fuse device FS denotes at least one fuse device disposed in each tuning control circuit.

Tuning control circuits 200a, 200b, and 200c generate tuning control signals TSa, TSb, and TSc each according to the state of built-in fuse device FS.

The tuning function in reference voltage generating circuits 112 and 114 and detecting circuit 144 is executed according to each of tuning control signals TSa, TSb, and TSc.

Figure 3:
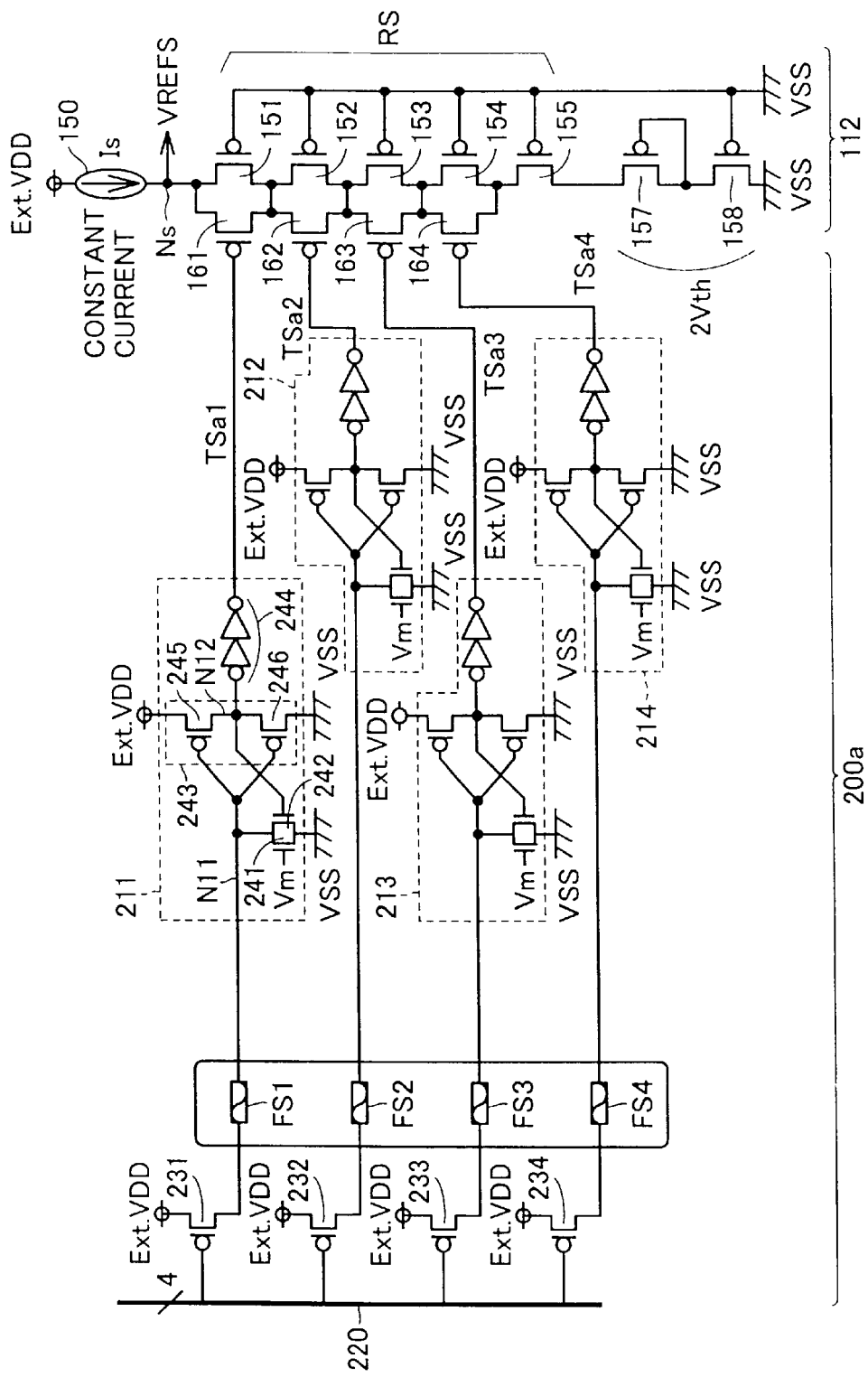
FIG. 3 is a circuit diagram showing the configuration of a tuning control circuit and a reference voltage generating circuit illustrated in FIG. 2.

In FIG. 3, the configurations of tuning control circuit 200a and corresponding reference voltage generating circuit 112 will be representatively described.

Referring to FIG. 3, reference voltage generating circuit 112 includes a current source 150 connected between node Ns for generating reference voltage VREFS and external source voltage Ext.VDD and P-channel MOS transistors 151 to 155, 157, and 158 connected in series between node Ns and ground voltage VSS. The gates of transistors 151 to 155 and 158 are connected to ground voltage VSS. A transistor 156 is connected so as to form a diode.

Figure 8:
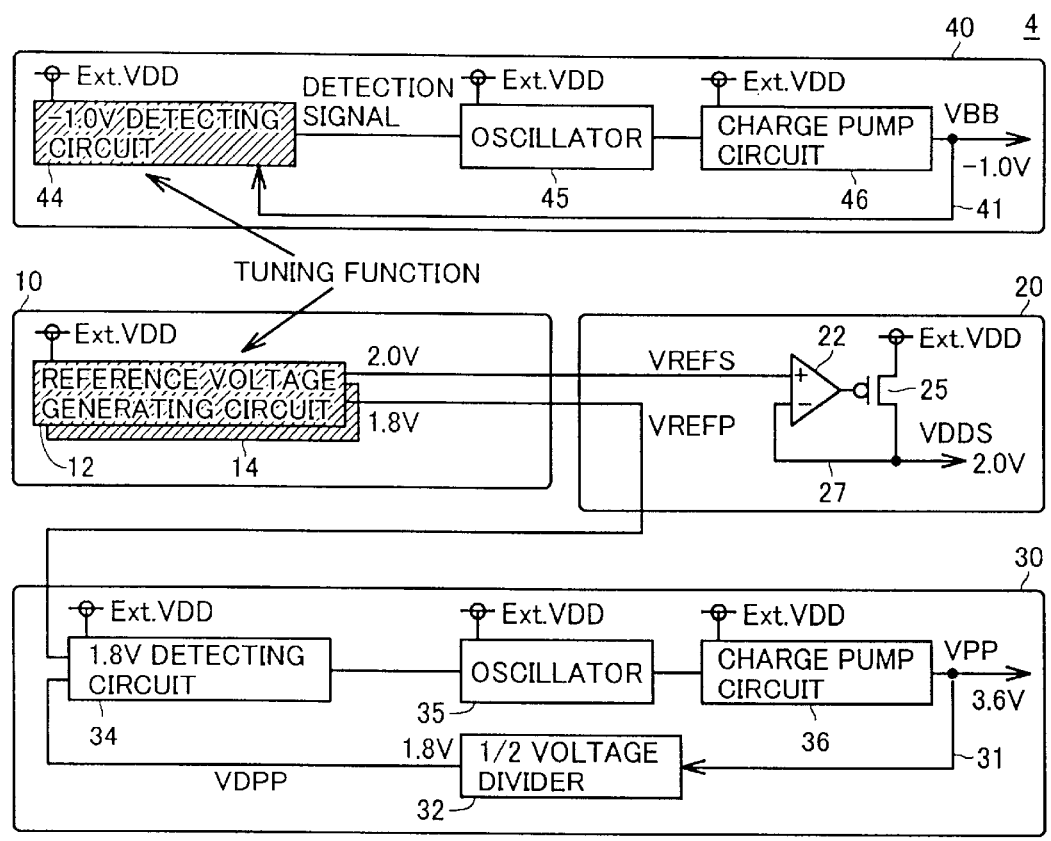
FIG. 8 is a schematic block diagram showing the configuration of the internal power circuit.
Figure 9:
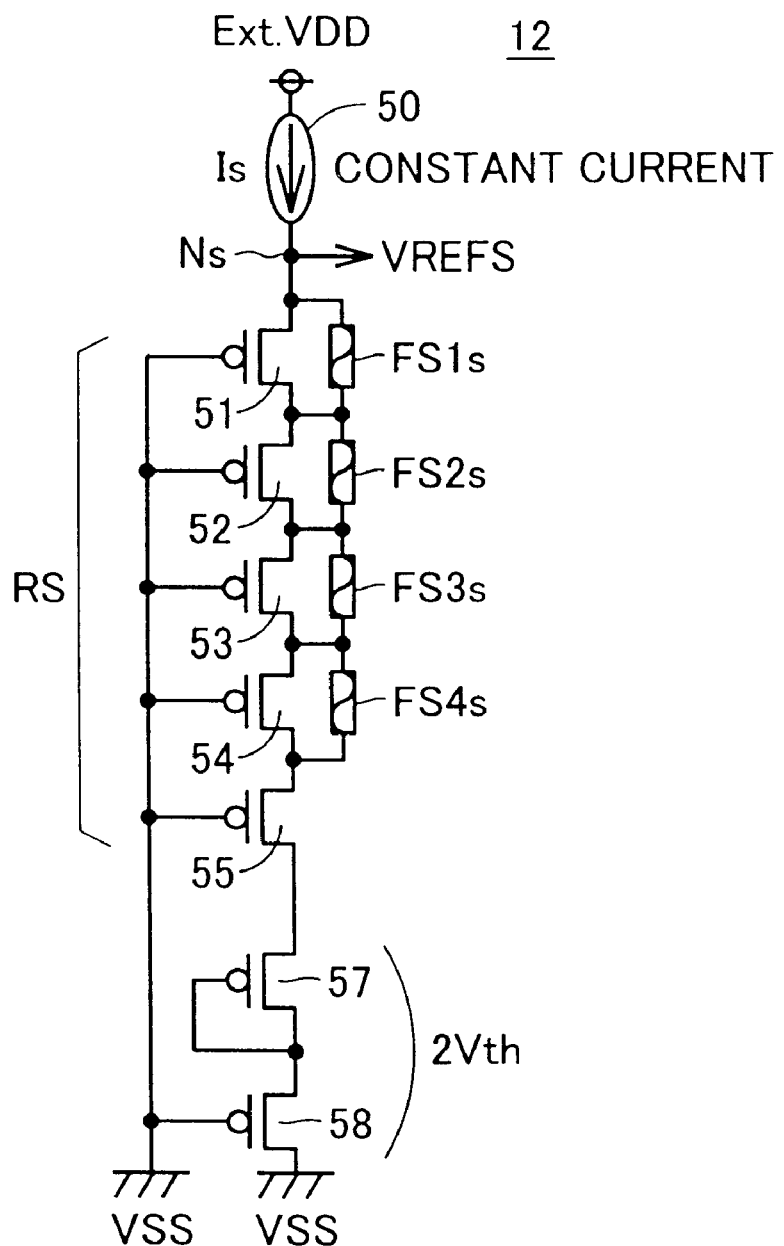
FIG. 9 is a circuit diagram showing the configuration of a reference voltage generating circuit for a memory array voltage.

Current source 150 corresponds to current source 50 shown in FIG. 8. Similarly, transistors 151 to 155, 156, and 158 correspond to P-channel MOS transistors 51 to 55, 57, and 58 shown in FIG. 8.

Reference voltage generating circuit 112 further includes transistors 161 to 164 (hereinbelow, called "tuning transistors") for finely adjusting the reference voltage in place of fuse devices FS1s to FS4s in reference voltage generating circuit 12 shown in FIG. 8. Tuning transistors 161 to 164 are connected in parallel with transistors 151 to 154 acting as resistive elements, respectively.

To the gates of tuning transistors 161 to 164, tuning control signals TSa1 to TSa4 are input, respectively. Tuning control signals TSa1 to TSa4 correspond to tuning control signal TSa generically shown in FIG. 2.

Tuning transistors 161 to 164 are provided to form or interrupt bypasses of transistors 151 to 154 acting as resistive elements in response to tuning control signals TSa1 to TSa4. The on-state resistance of turning transistors 161 to 164 is set to a value sufficiently lower than that of transistors 151 to 154.

Tuning control circuit 200a includes fuse devices FS1 to FS4 provided in correspondence with tuning transistors 161 to 164, signal driving circuits 211 to 214, a fuse energization control line 220, and fuse energization switch transistors 231 to 234.

Each of fuse energization switch transistors 231 to 234 is disposed between external source voltage Ext.VDD and each of fuse devices FS1 to FS4. Fuse energization control line 220 transmits a four-bit control signal to be input to the gate of each of fuse energization switch transistors 231 to 234. Each of bits in the control signal transmitted by the fuse energization switch transistor is normally set to the ground voltage VSS level. Each of fuse devices FS1 to FS4 is therefore electrically connected to external source voltage Ext.VDD.

Signal driving circuits 211 to 214 generate tuning control signals TSa1 to TSa4 in correspondence with the states (conductive state/nonconductive state) of corresponding fuse devices FS1 to FS4 when corresponding fuse energization switch transistors 231 to 234 are ON, respectively.

Since the configurations and operations of signal driving circuits 211 to 214 are similar to each other, the operation of signal driving circuit 211 will be described representatively.

Signal driving circuit 211 includes N-channel MOS transistors 241 and 242 connected in parallel between a node N11 electrically connected to fuse device FS1 and ground voltage VSS, an inverter 243 for inverting the voltage level of node N11 and outputting the resultant to a node N12, and an amplifier 244 for generating tuning control signal TSa1 in accordance with the voltage level of node N12.

Inverter 243 has a p-channel MOS transistor 245 electrically connected between external source voltage Ext.VDD and node N12 and an N-channel MOS transistor 246 electrically connected between node N12 and ground voltage VSS.

An intermediate voltage Vm is applied to the gate of transistor 241. The gate of transistor 242 is connected to node N12. The gates of transistors 245 and 246 are connected to node N11.

When corresponding fuse energization switch transistor 231 is turned on, in the case where fuse device FS1 is blown, that is, in a nonconductive state, the voltage at node N11 is pulled down to ground voltage VSS by transistor 241. Therefore, an output of inverter 243, that is, the voltage level of node N12 is set to the H level (external source voltage Ext. VDD), and tuning control signal TSa1 is also set to the H level (external source voltage Ext.VDD).

In response to this, corresponding tuning transistor 161 is turned off. The bypass of transistor 151 functioning as a resistive element is accordingly interrupted. To electrical resistance value RS for adjusting reference voltage VREFS, an electrical resistance value by transistor 151 is added.

In this case, the H level (external source voltage Ext.VDD) at node N12 and the L level (ground voltage VSS) at node Nil are latched by transistors 242 and 243.

On the other hand, in a state where fuse device FS1 is not blown, that is, in a conductive state, node N11 is set at the H level (external source voltage Ext.VDD). The voltage level at node N12 is set to the L level (ground voltage VSS) and tuning control signal TSa1 is also set to the L level (ground voltage VSS). By the operation, tuning transistor 161 is turned off, and the bypass of transistor 151 acting as a resistive element is formed. To electric resistance value RS, therefore, the electrical resistance value by transistor 151 cannot be added.

Each of signal driving circuits 212 to 214 have a configuration similar to signal driving circuit 211. Specifically, signal driving circuit 212 sets the level of tuning control signal TSa2 input to the gate of tuning transistor 162 in accordance with the conductive/interrupted state of fuse device FS2. Similarly, signal driving circuit 213 sets the level of tuning control signal TSa3 input to the gate of tuning transistor 163 in accordance with the conductive/interrupted state of fuse device FS3. Signal driving circuit 214 sets the level of tuning control signal TSa4 input to the gate of tuning transistor 164 in accordance with the conductive/interrupted state of fuse device FS4.

With such a configuration, fuse devices FS1 to FS4 for finely adjusting electrical resistance value RS, that is, reference voltage VREFS can be disposed apart from reference voltage generating circuit 112. As a result, fuse devices FS1 to FS4 can be disposed, for example, at an end of the internal power circuit (peripheral portion of the chip).

Tuning control signals TSa1 to TSa4 input to the gates of tuning transistors 161 to 164 are amplified by signal driving circuits 211 to 214, respectively. Consequently, the line for transmitting the tuning control signal is not a high impedance line. Even when a fuse device is disposed in a position apart from a circuit group requiring the tuning function, tuning transistors 161 to 164 can be accurately turned on/off while increasing noise resistance.

Figure 10:
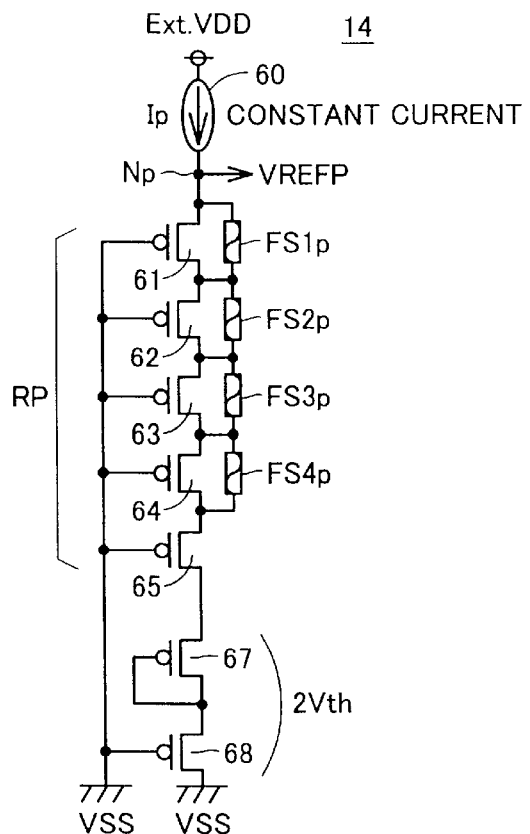
FIG. 10 is a circuit diagram showing the configuration of a reference voltage generating circuit for a boosted voltage.

The configuration of each of tuning control circuits 200b and 200c is similar to that of tuning control circuit 200a. In a manner similar to reference voltage generating circuit 112, in reference voltage generating circuit 114, it is sufficient to dispose tuning transistors having gates for receiving tuning control signal TSb from tuning control circuit 200b in place of fuse devices FS1p to FS4p in the configuration of reference voltage generating circuit 14 shown in FIG. 10.

Figure 11:
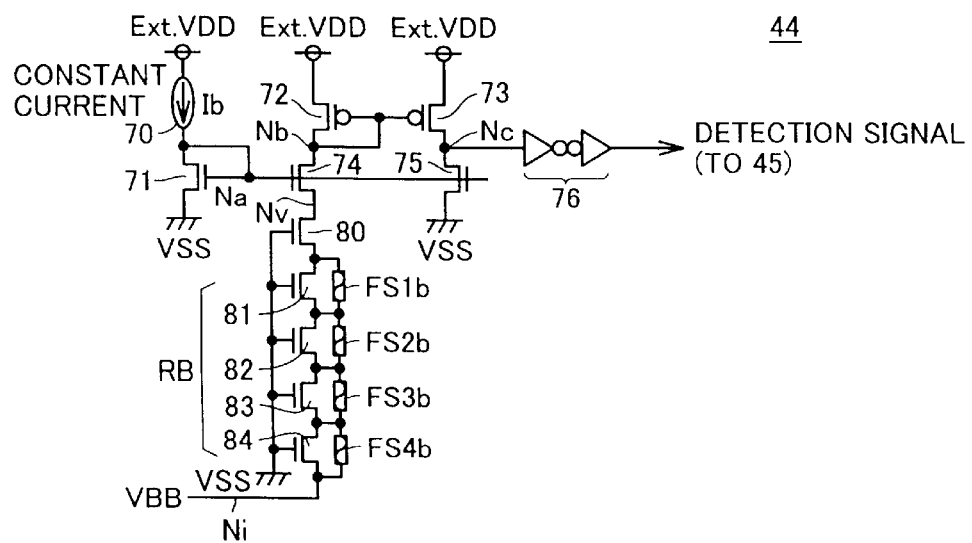
FIG. 11 is a circuit diagram showing the configuration of a detecting circuit for a negative voltage.

In detecting circuit 144, it is sufficient to dispose tuning transistors having gates for receiving tuning control signal TSc from tuning control circuit 200c in place of fuse devices FS1b to FS4b in the configuration of detecting circuit 44 shown in FIG. 11.

In the description of FIG. 3, the number of pairs of transistors acting as tuning transistors and resistive elements is four. The number is just an example and an arbitrary number of pairs can be disposed. In this case as well, by disposing fuse devices in correspondence with the pairs, a similar effect can be produced.

The layout of internal power circuit 110 according to a first embodiment will now be described by referring to FIGS. 4A and 4B.

Figure 4A:
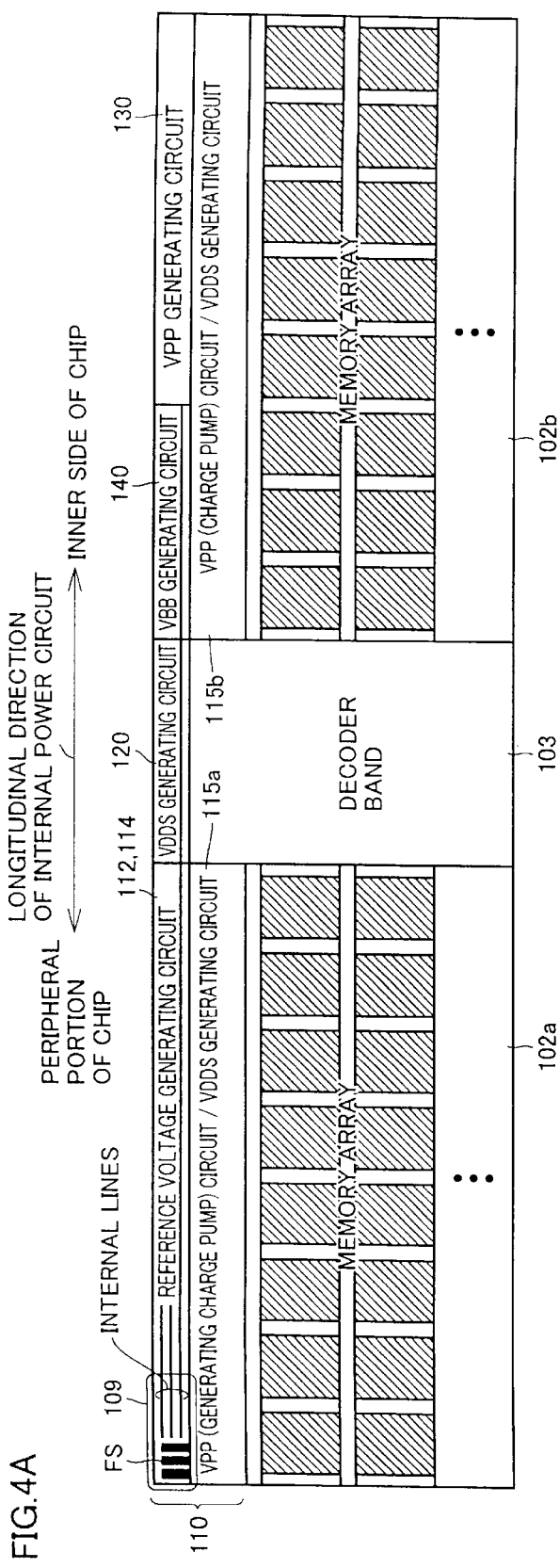
FIGS. 4A and 4B are conceptual diagrams for explaining the layout of the internal power circuit according to a first embodiment.

By referring to FIG. 4A, the layout of reference voltage generating circuits 112 and 114, memory array voltage generating circuit 120, boosted voltage (VPP) generating circuit 130, and negative voltage (VBB) generating circuit 140 shown in FIG. 2 is determined so as to be adjusted to the shape of internal power circuit 110.

Reference voltages VREFS and VREP generated by reference voltage generating circuits 112 and 114 are transmitted to memory array voltage (VDDS) generating circuit 120 and boosted voltage (VPP) generating circuit 130. Driver transistor 25 in memory array voltage generating circuit 120 and charge pump circuit 36 in boosted voltage generating circuit 130 are disposed in areas 115a and 115b adjacent to memory arrays 102a and 102b, respectively.

By providing the tuning function by using tuning control circuits 200a to 200c, fuse device FS can be disposed in an arbitrary position on the power circuit, for example, at an end of the layout corresponding to an end portion in the longitudinal direction of the layout of the internal power circuit.

Figure 4B:
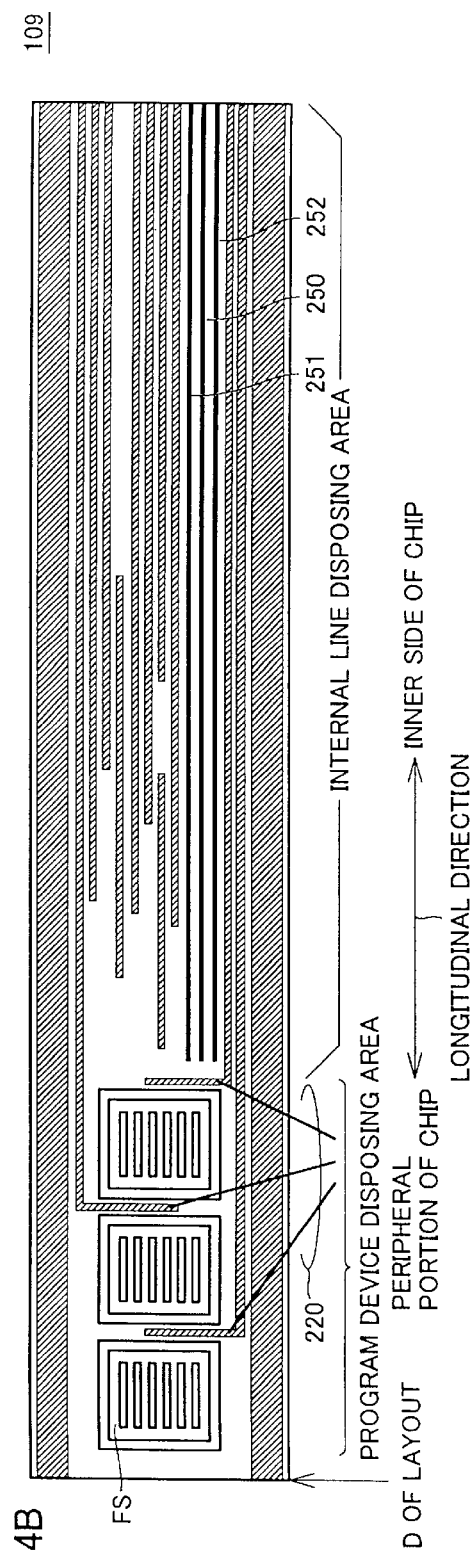

FIG. 4B is an enlarged diagram of an area 109 around fuse device FS shown in FIG. 4A.

With reference to FIG. 4B, in area 109 in internal power circuit 110, 30 the internal lines including a line for transmitting a reference voltage and the like and a power line and fuse device FS can be disposed in different areas. That is, the internal line disposing area and the program device disposing area can be made separate from each other.

Figure 7A:
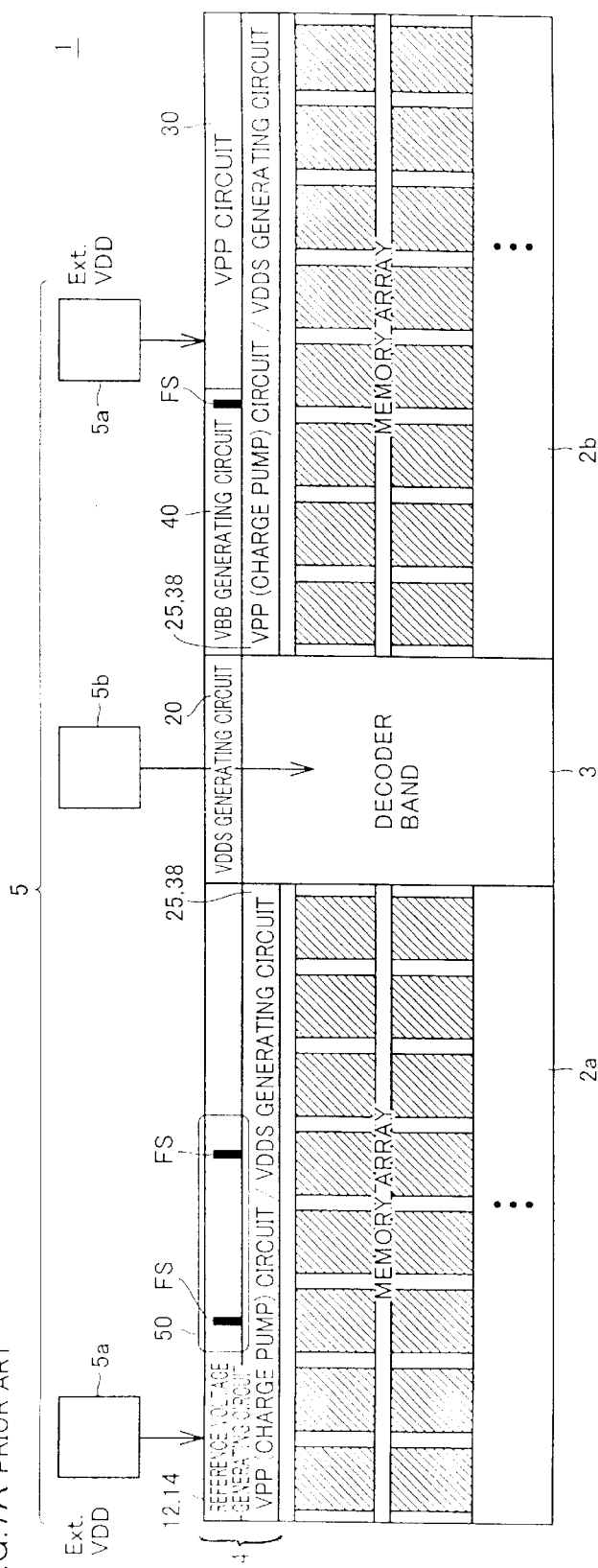
FIGS. 7A and 7B are diagrams for explaining a conventional layout of an internal power circuit in a semiconductor memory device.
Figure 7B:
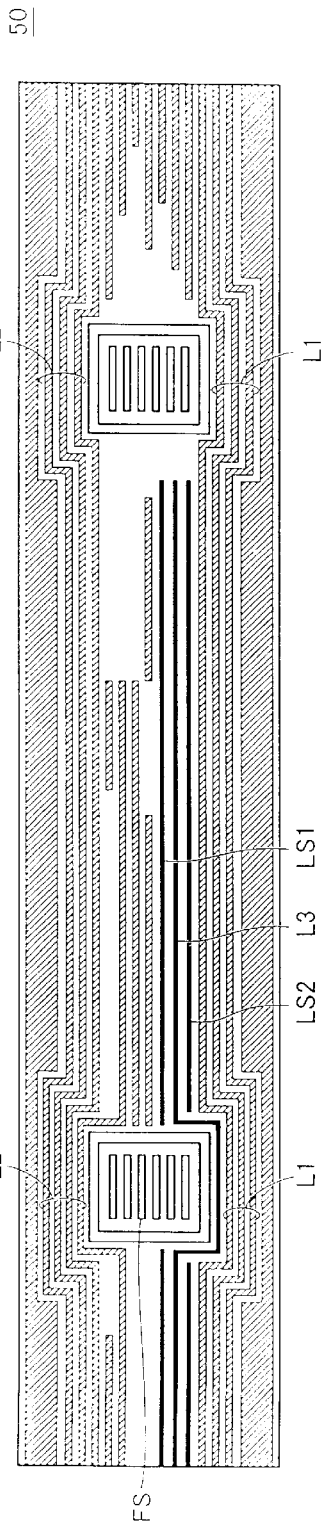

As understood from the comparison between FIGS. 4B and 7B, on the inside of internal power circuit 110, the internal lines can be disposed flexibly with sufficiently assured line width without bypassing fuse devices FS. Therefore, a layout such that, for example, shielding ground lines 251 and 252 are provided on both sides of a line 250 for transmitting reference voltages VREFS and VREFP to increase noise resistance can be also designed.

As described above, only aluminum lines corresponding to the fuse energization control line 220 shown in FIG. 3 are disposed around fuse device FS, and the circuit device group and the internal line group necessary for the operation control of the internal power circuit are disposed on the inner side in the chip as compared with the fuse devices. With a configuration, the design of the internal power circuit is facilitated and stabilization of the circuit operation can be realized. Further, the number of lines crossing the upper and lower areas of the fuse devices can be reduced, so that the improved flexibility of the designing can be realized.

Further, when the current driving capability of signal driving circuits 211 to 214 shown in FIG. 3 is sufficiently assured, fuse devices FS can be disposed in sufficiently apart positions on the outside of the internal power circuit. As a result, by concentratedly disposing fuse device FS in an area shared by fuse devices used in other internal circuits in semiconductor memory device 101, the layout efficiency of the whole semiconductor memory device can be also improved.

Second Embodiment

Figure 5:
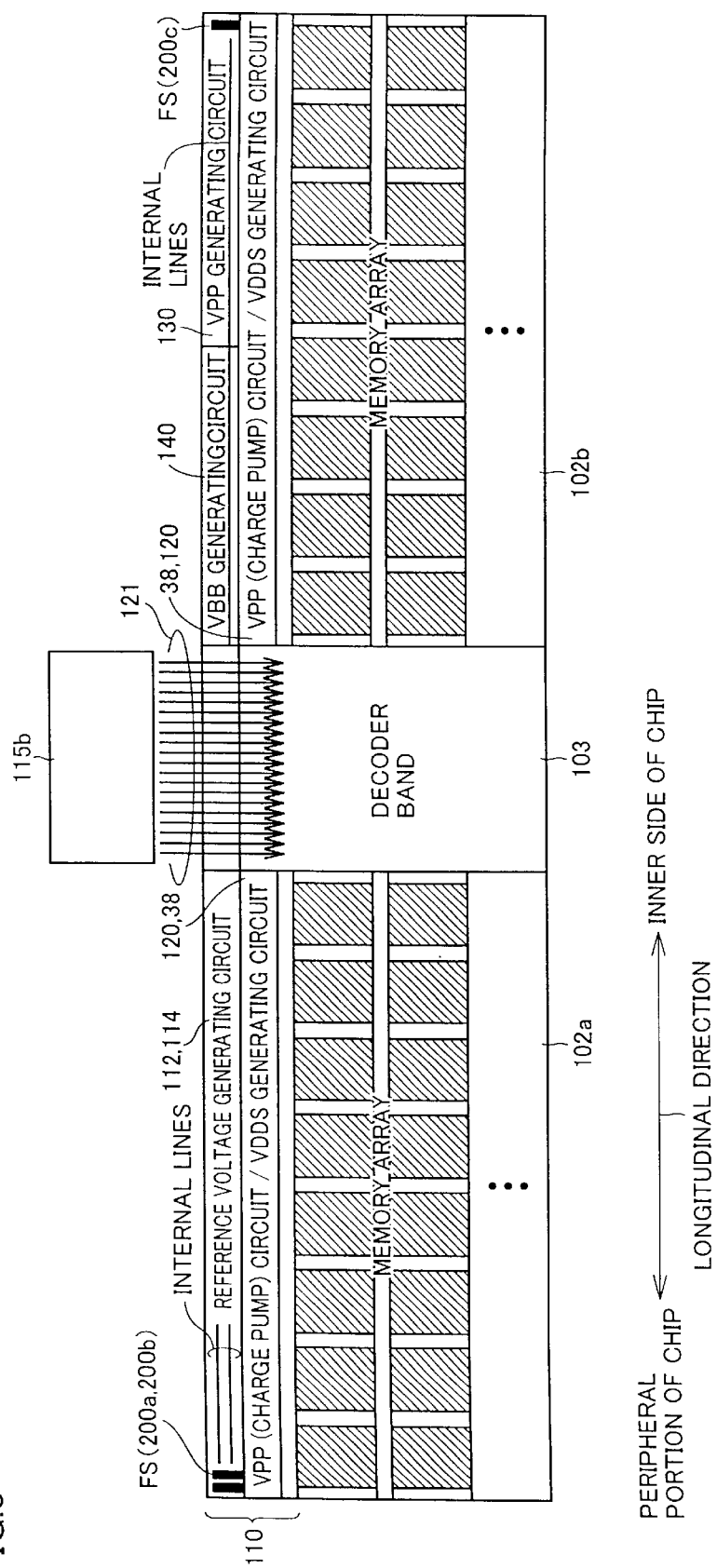
FIG. 5 is a conceptual diagram for explaining the layout of an internal power circuit according to a second embodiment.

Referring to FIG. 5, the layout of an internal power circuit according to a second embodiment is different from that of FIG. 4A with respect to a point that fuse devices FS are disposed on both sides in internal power circuit 110. Specifically, fuse devices FS for finely adjusting reference voltages VREFS and VREFP in reference voltage generating circuits 112 and 114 are disposed on the reference voltage generating circuit side (left side in FIG. 5). On the other hand, fuse devices disposed in correspondence with detecting circuit 144 in negative voltage generating circuit 140 are disposed in an end area on the memory array 102b side (right side in FIG. 5).

In the center portion of internal power circuit 110, there is an area crossing a line group 121 for transmitting signals between signal pad 115b and decoder band 103. As described above, in internal power circuit 110, fuse devices used on the right and left sides of the center band are disposed so as to be divided, thereby enabling the signal lines for transmitting tuning control signals TSa to TSc shown in FIG. 2 can be disposed without crossing line group 121.

As a result, the noise resistance of the tuning control signal can be further increased, that is, the tuning function of internal power circuit 110 can be displayed with increased noise resistance.

Third Embodiment

Figure 6:
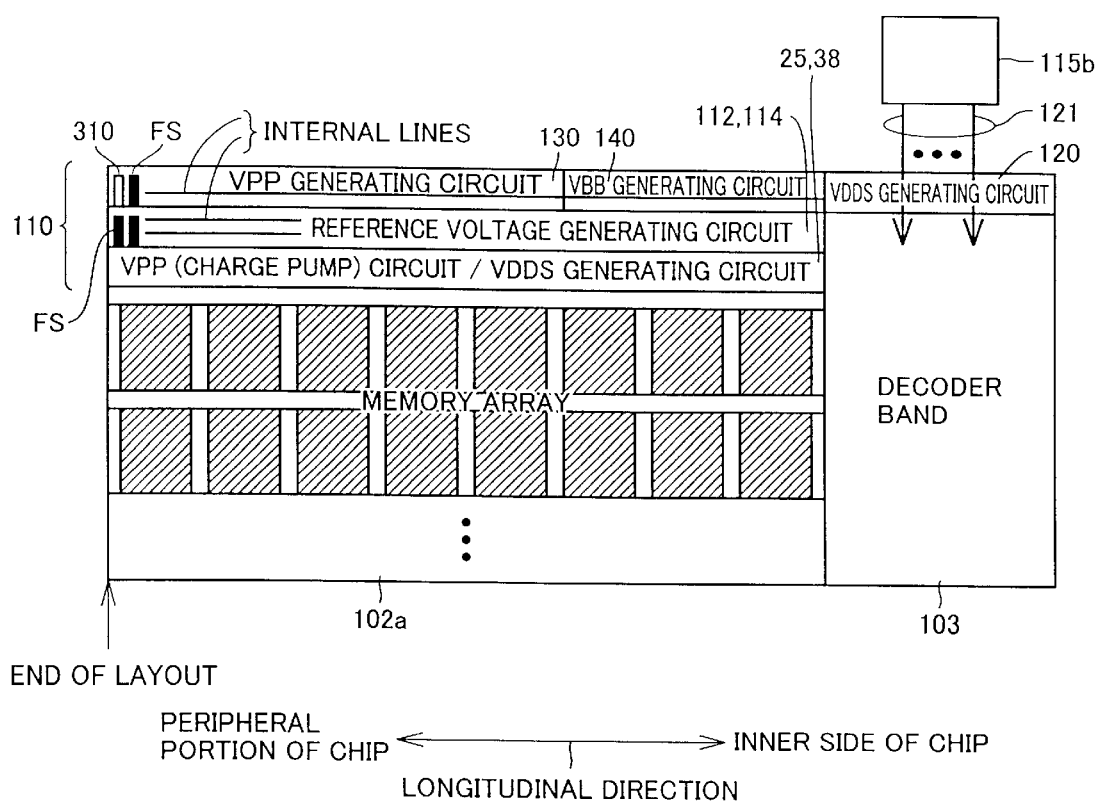
FIG. 6 is a conceptual diagram for explaining the layout of an internal power circuit according to a third embodiment.

Referring to FIG. 6, in the layout of an internal power circuit according to a third embodiment, a configuration in which the capacity of the memory array is the half of that in each of the first and second embodiments, to be specific, a configuration in which only memory array 102a is disposed is shown.

Decoder band 103 is therefore disposed on one side of memory array 102a. As already described above, line group 121 through which signals are transmitted/received to/from signal pad 115b is provided for decoder band 103. It is consequently desirable that fuse devices FS are disposed in an area apart from decoder band 103 as much as possible.

In the configuration according to the third embodiment, therefore, fuse devices FS are disposed in an end portion of the layout (chip peripheral portion) on the side opposite to the decoder band in internal power circuit 110.

In an area outside of fuse device FS, only a circuit element group 310 used for controlling fuse information is disposed. For example, such circuit element group 310 corresponds to fuse energization switch transistors 231 to 234 shown in FIG. 3. Such a configuration can be applied also to the configurations according to the first and second embodiments.

With such a configuration, in circuit element group 310, fuse energization control line 220 for reference voltage generating circuits 112 and 114 and detecting circuit 144 in the reference voltage generating circuit can be shared by a common line. Thus, the number of lines crossing free areas on the upper and lower sides of fuse device FS can be reduced, and the flexibility in designing can be further improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    an internal circuit operating on supply of an internal source voltage; and
    an internal power circuit for receiving an external source voltage and generating said internal source voltage,
    said internal power circuit including:
        a plurality of internal lines;
        a plurality of program devices disposed in an area different from an area in which said plurality of internal lines are disposed and each shifting from a first state to a second state in response to a program input external to said internal power circuit;
        a plurality of signal driving circuits provided in correspondence with said plurality of program devices and each for driving a control signal having a level according to the state of a corresponding one of said plurality of program devices; and
        an internal voltage generating circuit for adjusting the level of said internal source voltage on the basis of said control signal driven by each of said plurality of signal driving circuits.

2. The semiconductor memory device according to claim 1,
    wherein said internal voltage generating circuit comprises:
        a reference voltage generating unit for generating a reference voltage corresponding to a reference value of said internal source voltage; and
        an internal voltage driving unit for controlling said internal source voltage on the basis of comparison between said internal source voltage and said reference voltage, and said reference voltage generating unit adjusts said reference voltage on the basis of said control signal.

3. The semiconductor memory device according to claim 1,
wherein said internal voltage generating circuit includes:
a detecting unit for detecting that said internal source voltage exceeds a reference value; and
an internal voltage driving portion for controlling said internal source voltage on the basis of a detection result of said detecting unit, and
said detecting unit adjusts said reference value on the basis of said control signal.

4. The semiconductor memory device according to claim 1, further comprising a power source pad for receiving supply of said external source voltage, and
said internal power circuit is disposed in an elongated shape between said internal circuit and said power source pad along an peripheral portion of said internal circuit.

5. The semiconductor memory device according to claim 4, wherein said program devices are disposed in a chip peripheral portion.

6. The semiconductor memory device according to claim 4, wherein said program devices are disposed in an end portion of said internal power circuit.

7. The semiconductor memory device according to claim 4, wherein a circuit device group constructed by said internal voltage generating circuit and said plurality of signal driving circuits is disposed on the inner side of said plurality of program devices in the chip along a longitudinal direction of said internal power circuit.

8. The semiconductor memory device according to claim 4, wherein said plurality of internal lines include a program device control line for transmitting signals for controlling current passage to said plurality of program devices, and
a line group other than said program device control line in said plurality of internal lines is disposed on the inner side of said plurality of program devices of the chip along a longitudinal direction of said internal power circuit.

9. The semiconductor memory device according to claim 4, wherein said internal power circuit further includes a program device energization control circuit for controlling current passage to said plurality of program devices, and
circuit elements as components of said internal power circuit is disposed on the inner side of said plurality of program devices of the chip along a longitudinal direction of said internal power circuit except for a circuit device group constructing said program device energization control circuit.

10. The semiconductor memory device according to claim 4, wherein said internal power circuit further includes a program device energization control circuit for controlling current passage to said plurality of program devices, and
circuit elements as components of said plurality of signal driving circuits and said program device energization control circuit are disposed in an area different from an area in which other circuit devices in said internal power circuit are disposed.

11. The semiconductor memory device according to claim 1, further comprising:
a signal pad for inputting/outputting signals from/to said internal circuit; and
a signal line provided between said signal pad and said internal circuit, for transmitting said signal,
wherein said plurality of internal lines are disposed without crossing said signal line.

12. The semiconductor memory device according to claim 11, wherein said program devices are disposed at both ends in the longitudinal direction of said internal power circuit.

13. The semiconductor memory device according to claim 11, wherein said program devices are disposed only at one end in the longitudinal direction of said internal power circuit.

14. The semiconductor memory device according to claim 1, wherein said internal circuit comprises a memory array portion including a plurality of memory cells for storing data and peripheral circuits for reading/writing data from/to said plurality of memory cells.

15. The semiconductor memory device according to claim 1, wherein said program device is a fuse device which can be blown by a laser beam applied external to said internal power circuit.

16. The semiconductor memory device according to claim 1, wherein said program device is a fuse device which can be blown by a high voltage applied external to said internal power circuit.

17. The semiconductor memory device according to claim 1, wherein said plurality of internal lines include a first line in a high impedance state and a second line for shielding said first line.

* * * * *